United States Patent
Brooks

(10) Patent No.: US 9,490,011 B2
(45) Date of Patent: Nov. 8, 2016

(54) STORAGE DEVICE WRITE PULSE CONTROL

(71) Applicant: Hewlett-Packard Development Company, L.P., Houston, TX (US)

(72) Inventor: Robert J. Brooks, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/903,657

(22) PCT Filed: Jul. 10, 2013

(86) PCT No.: PCT/US2013/049951
§ 371 (c)(1),
(2) Date: Jan. 8, 2016

(87) PCT Pub. No.: WO2015/005920
PCT Pub. Date: Jan. 15, 2015

(65) Prior Publication Data
US 2016/0172033 A1 Jun. 16, 2016

(51) Int. Cl.
*G11C 13/00* (2006.01)
*G11C 8/18* (2006.01)

(52) U.S. Cl.
CPC ............ *G11C 13/0097* (2013.01); *G11C 8/18* (2013.01); *G11C 13/0007* (2013.01); *G11C 13/0023* (2013.01); *G11C 13/0026* (2013.01); *G11C 13/0028* (2013.01); *G11C 13/0061* (2013.01); *G11C 13/0069* (2013.01); *G11C 2013/0073* (2013.01); *G11C 2013/0092* (2013.01)

(58) Field of Classification Search
CPC . G11C 8/18; G11C 13/0007; G11C 13/0023; G11C 13/0026; G11C 13/0028; G11C 13/0061; G11C 13/0069; G11C 13/0097; G11C 2013/0073; G11C 2013/0092
See application file for complete search history.

(56) References Cited

U.S. PATENT DOCUMENTS

| | | | |
|---|---|---|---|
| 7,153,721 B2 | 12/2006 | Campbell | |
| 7,359,227 B2 | 4/2008 | Dennison et al. | |
| 7,885,121 B2* | 2/2011 | Takase | G11C 13/0007 365/148 |
| 8,199,556 B2 | 6/2012 | Srinivasan et al. | |
| 8,462,580 B2* | 6/2013 | Rabkin | G11C 13/0007 365/148 |
| 8,593,853 B2* | 11/2013 | Katoh | G11C 13/004 365/100 |

(Continued)

OTHER PUBLICATIONS

International Search Report and Written Opinion dated Apr. 9, 2014, PCT Patent Application No. PCT/US2013/049951 dated Jul. 10, 2013 (ISA/KR).

(Continued)

*Primary Examiner* — Vanthu Nguyen
(74) *Attorney, Agent, or Firm* — Mannava/Kang, P.C.

(57) ABSTRACT

According to an example, a method for storage device write pulse control may include writing a storage device to a first polarity by driving a row address line (RAL) and a column address line (CAL) to an intermediate voltage level RCA for a cycle A. The RAL may be driven to a voltage level RB for a cycle B pulse duration, and the CAL may be maintained at RCA for the cycle B pulse duration. The RAL may be driven to a voltage level RC for a cycle C pulse duration, and the CAL may be driven to a voltage level CC for the cycle C pulse duration. The RAL may be driven to RCA, and the CAL may be driven to a voltage level CD for a cycle D pulse duration. The RAL may be maintained at RCA, and the CAL may be driven to RCA.

15 Claims, 8 Drawing Sheets

(56) References Cited

U.S. PATENT DOCUMENTS

| | | | |
|---|---|---|---|
| 8,854,873 B1* | 10/2014 | Hollmer | G11C 7/106 365/148 |
| 9,230,685 B2* | 1/2016 | Strand | G11C 29/08 |
| 2003/0123284 A1 | 7/2003 | Lowrey et al. | |
| 2005/0162907 A1 | 7/2005 | Campbell | |
| 2010/0238712 A1 | 9/2010 | Xi et al. | |
| 2011/0038195 A1 | 2/2011 | Hamilton et al. | |
| 2011/0134682 A1 | 6/2011 | Xi et al. | |
| 2011/0182104 A1 | 7/2011 | Kim et al. | |
| 2011/0280059 A1 | 11/2011 | Xiao et al. | |
| 2012/0063192 A1 | 3/2012 | Lee | |
| 2012/0074374 A1 | 3/2012 | Jo | |
| 2012/0147658 A1 | 6/2012 | Kim et al. | |
| 2012/0295398 A1 | 11/2012 | Kurunczi et al. | |
| 2013/0094275 A1* | 4/2013 | Chen | G11C 11/00 365/148 |

OTHER PUBLICATIONS

Kim, K-H. et al., A Functional Hybrid Memristor Crossbar-array/CMOS System for Data Storage and Neuromorphic Applications, Dec. 5, 2011, pp. 389-395, vol. 12; Issue: 1.

* cited by examiner

500

502
DRIVE A ROW ADDRESS LINE AND A COLUMN ADDRESS LINE OF THE STORAGE DEVICE TO APPROXIMATELY AN INTERMEDIATE VOLTAGE LEVEL RCA FOR A CYCLE A

504
DRIVE THE ROW ADDRESS LINE TO A VOLTAGE LEVEL RB GREATER THAN THE INTERMEDIATE VOLTAGE LEVEL RCA FOR A PREDETERMINED CYCLE B PULSE DURATION FOLLOWING THE CYCLE A, AND MAINTAIN THE COLUMN ADDRESS LINE AT APPROXIMATELY THE INTERMEDIATE VOLTAGE LEVEL RCA FOR THE PREDETERMINED CYCLE B PULSE DURATION

506
DRIVE THE ROW ADDRESS LINE TO A VOLTAGE LEVEL RC LOWER THAN THE INTERMEDIATE VOLTAGE LEVEL RCA FOR A PREDETERMINED CYCLE C PULSE DURATION FOLLOWING THE PREDETERMINED CYCLE B PULSE DURATION, AND DRIVE THE COLUMN ADDRESS LINE TO A VOLTAGE LEVEL CC HIGHER THAN THE INTERMEDIATE VOLTAGE LEVEL RCA FOR THE PREDETERMINED CYCLE C PULSE DURATION TO WRITE THE STORAGE DEVICE TO THE FIRST POLARITY

508
DRIVE THE ROW ADDRESS LINE TO APPROXIMATELY THE INTERMEDIATE VOLTAGE LEVEL RCA, AND DRIVE THE COLUMN ADDRESS LINE TO A VOLTAGE LEVEL CD LOWER THAN THE INTERMEDIATE VOLTAGE LEVEL RCA FOR A PREDETERMINED CYCLE D PULSE DURATION FOLLOWING THE PREDETERMINED CYCLE C PULSE DURATION

510
MAINTAIN THE ROW ADDRESS LINE AT APPROXIMATELY THE INTERMEDIATE VOLTAGE LEVEL RCA, AND DRIVE THE COLUMN ADDRESS LINE TO APPROXIMATELY THE INTERMEDIATE VOLTAGE LEVEL RCA FOLLOWING THE PREDETERMINED CYCLE D PULSE DURATION

STORAGE DEVICE WRITE PULSE CONTROL

CLAIM FOR PRIORITY

The present application is a national stage filing under 35 U.S.C. §371 of PCT application number PCT/US2013/049951, having an international filing date of Jul. 10, 2013, the disclosure of which is hereby incorporated by reference in its entirety.

BACKGROUND

In a storage device, such as a memristor, when current flows in one direction through the storage device, the electrical resistance increases, and when current flows in an opposite direction, the electrical resistance decreases. When the current is stopped, the last resistance in the memristor is retained. Further, when the flow of charge begins again, the resistance of the memristor reverts to a value when the memristor was last active. Such storage devices can be formed in an array configuration that includes a plurality of storage devices disposed, for example, in a row and column format. Each of the storage devices in the array can be individually addressed to read or write to the storage device. For example, a row and column can be individually addressed to read or write to a corresponding storage device.

BRIEF DESCRIPTION OF DRAWINGS

Features of the present disclosure are illustrated by way of example and not limited in the following figure(s), in which like numerals indicate like elements, in which:

FIG. 5 illustrates a method for storage device write pulse control, according to an example of the present disclosure;

DETAILED DESCRIPTION

Figure 1:
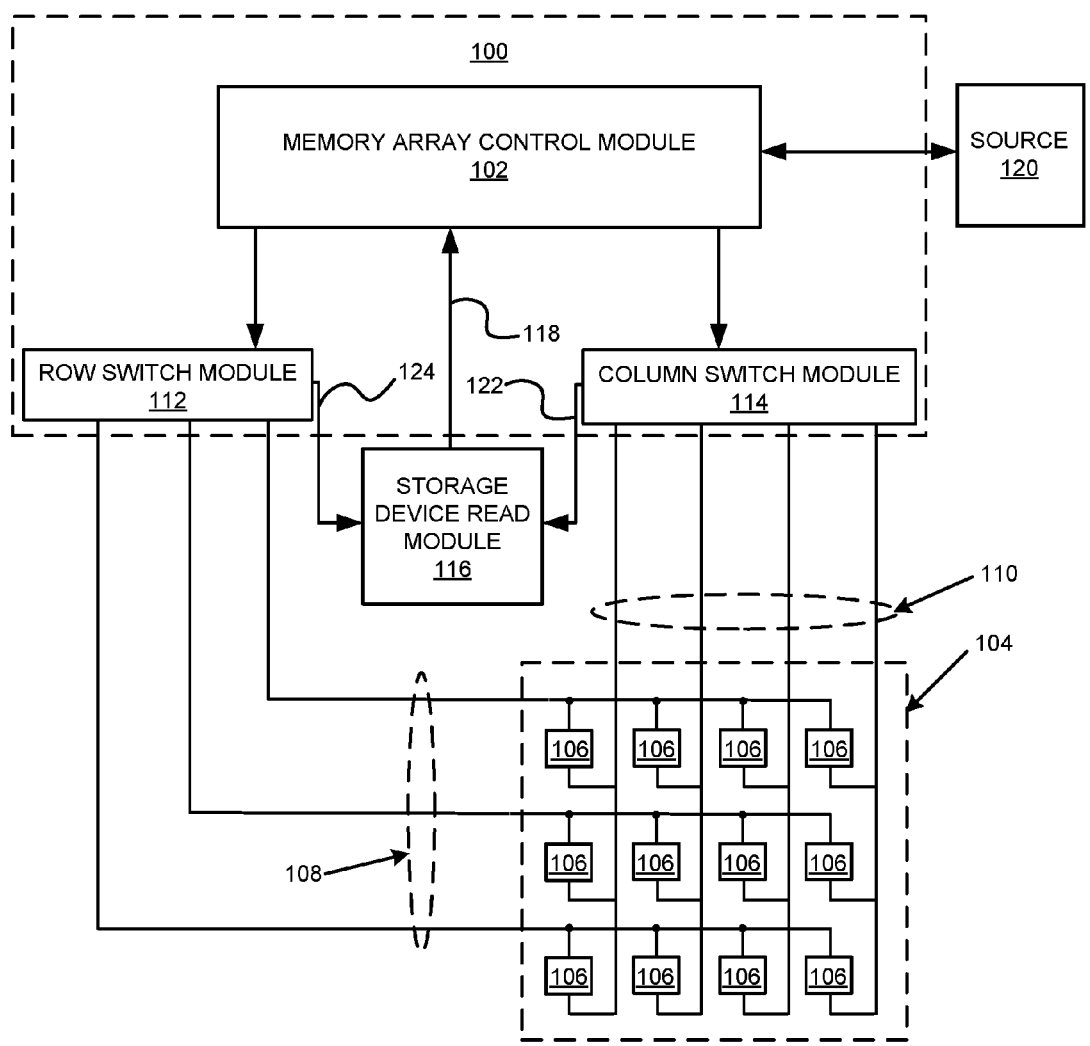
FIG. 1 illustrates an architecture of a storage device write pulse control apparatus, according to an example of the present disclosure.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

In a storage device, such as a memristor, that may be formed in an array configuration that includes a plurality of storage devices disposed, for example, in a row and column format, writing a particular storage device may affect non-written storage devices along the particular row and column corresponding to the written storage device. For example, when a memristor crosspoint array is written, spurious currents may flow through memristors other than the selected memristor. For example, spurious currents may flow through memristors that are connected to the same row and column as the selected memristor. The memristors that are connected to the same row and column as the selected memristor may be designated as half-selected memristors. Although these spurious currents are lower than the current through the selected memristor, the spurious currents may nevertheless change the state of a half-selected memristor by causing a small degree of ionic movement in the half-selected memristor. Over many accesses along the same row or column, the state of the half-selected memristor may be changed such that when the half-selected memristor is read, it shows a different value than was intentionally written.

According to an example, a storage device write pulse control apparatus and a method for storage device write pulse control are disclosed herein. The apparatus and method disclosed herein may eliminate the degree of unwanted ionic movement in half-selected memristors such that any net ionic movement is in the selected memristor that is being intentionally written, and any ionic movement in the half-selected memristors is canceled. The apparatus and method disclosed herein may arrange write pulses such that the selected memristor sees a full potential pulse which writes the selected memristor, and a pair of half potential pulses which nominally have no effect on the selected memristor, but cancel ionic movement in the half-selected memristors. For memristors that may need a plurality of full potential pulses to write, the full potential pulse may be part of a sequence of pulses which ultimately writes the selected memristor. Half-selected memristors may see a half-potential pulse in a first direction followed by a counterbalancing half-potential pulse in a direction that is opposite to the first direction. Further, fully unselected memristors (i.e., memristors that are neither on the row or column of the selected memristor) may see negligible stimulus of any kind. For the apparatus and method disclosed herein, pulse widths and/or pulse amplitudes may be arranged (e.g., varied) so as to account for ionic movement that occurs more readily in one direction than the other.

FIG. 1 illustrates an architecture of a storage device write pulse control apparatus 100, according to an example. Referring to FIG. 1, the apparatus 100 is depicted as including a memory array control module 102 to control a memory array 104 and various other operations of the apparatus 100. The memory array 104 may include a plurality of data storage devices 106, such as memristors. The memory array 104 may be a m×n memory array, where m corresponds to rows of the memory array and n corresponds to columns of the memory array. Each of the data storage devices 106 may be individually addressable by row address lines 108 and column address lines 110. A row switch module 112 may couple various aspects of the apparatus 100 to selected ones of the storage devices 106 by the row address lines 108. Similarly, a column switch module 114 may couple various aspects of the apparatus 100 to selected ones of the storage devices 106 by the column address lines 110. For example, the row and column switch modules 112 and 114, respectively, may generate write pulses to selected rows and columns of the row address lines 108 and the column address lines 110. A storage device read module 116 may determine a value of a bit in the particular storage device 106 addressed by the row address lines 108 and the column address lines 110. An output 118 of the storage device read module 116 may be fed to the memory array control module 102. The memory array control module 102 may receive data values from a source 120 that are to be written to the memory array 104 and provide data values that are stored in the memory array 104 to the source 120.

The modules and other components of the apparatus 100 that perform various other functions in the apparatus 100, may comprise machine readable instructions stored on a non-transitory computer readable medium. In addition, or alternatively, the modules and other components of the apparatus 100 may comprise hardware or a combination of machine readable instructions and hardware.

The memory array control module 102 may control the memory array 104 and various other operations of the apparatus 100. For example, the memory array control module 102 may store data values within the memory array 104, read data values from the memory array 104, control operations of the row switch module 112 and the column switch module 114, and receive data values from and provide data values to the source 120. The memory array control module 102 may use the row and column switch modules 112 and 114 to store (i.e., write or program) data values to the data storage devices 106, for example, by direct-current (DC) pulses formatted to increase or decrease the non-volatile electrical resistance of the selected data storage device 106. The memory array control module 102 may also retrieve (i.e., read) data values stored in the data storage devices 106 by the storage device read module 116.

The data storage devices 106 may store at least two distinct data values based on electrical characteristics thereof. For example, the data storage devices 106 may include electrical characteristics such as resistance, capacitance, inductance, or a combination thereof. Each data storage device 106 may store one bit of binary data-value (e.g., 0 or 1) based on a non-volatile adjustment in electrical resistance thereof. The data storage devices 106 may also store other types of data-values (e.g., base-three, base-eight, etc.). The memory array 104 may include a plurality of the data storage devices 106, such as memristors. In the example of FIG. 1, the memory array 104 is illustrated as including twelve data storage devices 106. However, those skilled in the art would appreciate in view of this disclosure that the memory array 104 may include any number of the data storage devices 106. Each of the data storage devices 106 may be individually addressable by one of the row address lines 108 and the column address lines 110 to write to or read stored data values.

The row switch module 112 may couple various aspects of the apparatus 100 to selected ones of the storage devices 106 by the row address lines 108. Similarly, the column switch module 114 may couple various aspects of the apparatus 100 to selected ones of the storage devices 106 by the column address lines 110. The row and column switch modules 112 and 114, respectively, may include, field-effect transistors (FETs), pass FETs, pass gates, diodes, bipolar transistors, electromechanical switches, or other devices.

The storage device read module 116 may determine a value of a bit stored in the particular storage device 106 addressed by the row address lines 108 and the column address lines 110. The storage device read module 116 may be coupled to selected ones of the storage devices 106 by the row and column switch modules 112 and 114, respectively. A particular storage device 106 may define part of a feedback pathway or loop when coupled to the storage device read module 116 by an input node 122, an output node 124, the row switch module 112 and the column switch module 114. A selected storage device 106 may be disposed in a series arrangement in a feedback loop with respect to the storage device read module 116. The feedback loop may be formed upon coupling of the selected storage device 106 with the storage device read module 116 by the row switch module 112 and the column switch module 114. For example, the storage device read module 116 may be selectively coupled to the storage devices 106 by the row address lines 108 and the column address lines 110 so as to establish a feedback loop.

Figure 2:
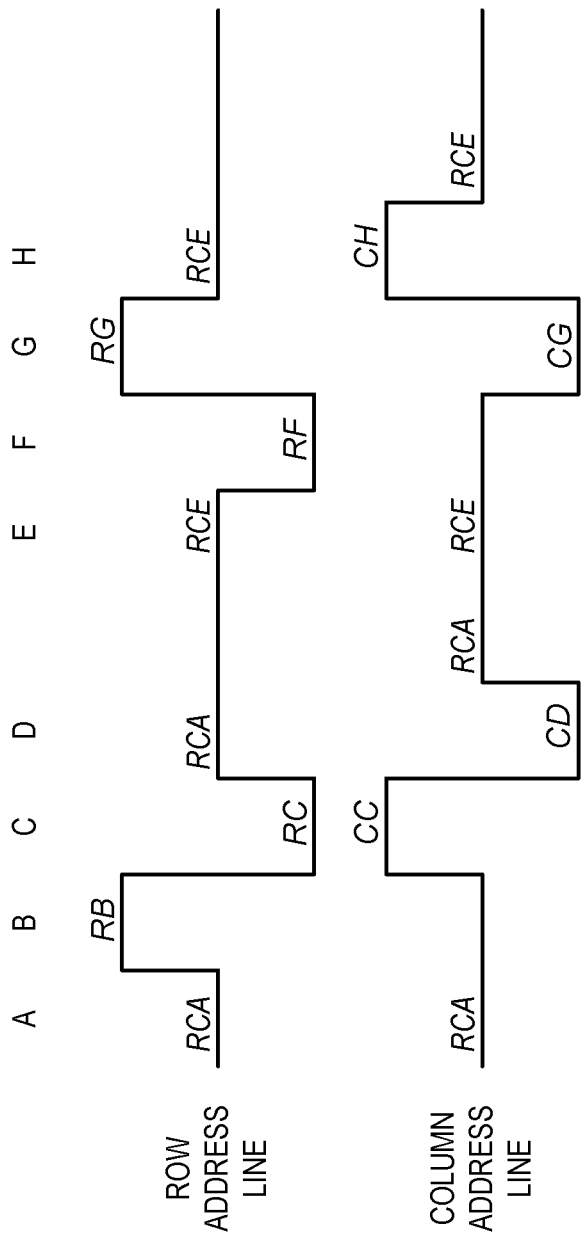
FIG. 2 illustrates a length and phase diagram of row and column pulses applied by the storage device write pulse control apparatus, according to an example of the present disclosure.

Referring to FIGS. 1 and 2, FIG. 2 illustrates a length and phase diagram of row and column pulses applied by the storage device write pulse control apparatus 100, according to an example of the present disclosure. Specifically, the row switch module 112 and the column switch module 114 may respectively arrange write pulses for writing to a selected storage device 106 of the memory array 104. At cycle A, the corresponding row address line (of the row address lines 108) and the corresponding column address line (of the column address lines 110) of a selected storage device 106 of the memory array 104 may be driven to approximately an intermediate voltage level RCA (e.g., approximately 1 Volts). The intermediate voltage level RCA may correspond to an idle condition of the memory array 104. In the example of FIG. 2, the intermediate voltage level RCA may correspond to a midpoint of the maximum and minimum voltage levels illustrated in FIG. 2. However, those skilled in the art would appreciate in view of this disclosure that the intermediate voltage level RCA may be set at any level between the maximum and minimum voltage levels based, for example, on the characteristics of the storage device 106. At cycle A, other rows and columns in the memory array 104 may be undriven. Further, the undriven rows and columns in the memory array 104 may remain near the intermediate voltage level RCA, provided that the undriven rows and columns are driven to the intermediate voltage level RCA before they become undriven.

At cycle B, the corresponding row address line of the selected storage device 106 may be driven to high voltage level (e.g., approximately 2 Volts), whereas the corresponding column address line of the selected storage device 106 may be maintained at the intermediate voltage level. For example, the row address line (and thus the row terminal of the selected storage device 106) may be driven to a voltage level RB greater than the intermediate voltage level RCA for a predetermined cycle B pulse duration following the cycle A, and the column address line (and thus the column terminal of the selected storage device 106) may be maintained at approximately the intermediate voltage level RCA for the predetermined cycle B pulse duration. The pulse corresponding to cycle B may counterbalance the negative row pulse on the next cycle C (e.g., a low voltage level of approximately 0 volts)

At cycle C, the corresponding column address line of the selected storage device 106 may be driven to a full potential so that the selected storage device 106 is written. For example, the row address line may be driven to a voltage level RC lower than the intermediate voltage level RCA for a predetermined cycle C pulse duration following the predetermined cycle B pulse duration, and the column address line may be driven to a voltage level CC higher than the intermediate voltage level RCA for the predetermined cycle C pulse duration to write the storage device to a first polarity (e.g., a low or high resistance state depending on the characteristics of the selected storage device 106). Further, the voltage levels RB and RC may be defined such that the predetermined cycle B pulse duration for the row address line counterbalances the predetermined cycle C pulse duration for the row address line. Therefore, for half-selected storage devices 106 along the row address line for the selected storage device 106, any net ionic movement may be canceled by the counterbalancing voltage levels RB and RC.

At cycle D, the corresponding row address line of the selected storage device 106 may be driven to the intermediate voltage level, and the corresponding column address line of the selected storage device 106 may be driven to a low voltage level. For example, the row address line may be driven to approximately the intermediate voltage level RCA, and the column address line may be driven to a voltage level CD lower than the intermediate voltage level RCA for a predetermined cycle D pulse duration following the predetermined cycle C pulse duration. At the predetermined cycle D pulse duration, the driving of the corresponding column address line of the selected storage device 106 to a low voltage level may balance the corresponding column address line having been driven to a high voltage level on the previous cycle C. Further, the voltage levels CC and CD may be defined such that the predetermined cycle C pulse duration for the column address line counterbalances the predetermined cycle D pulse duration for the column address line. Therefore, for half-selected storage devices 106 along the column address line for the selected storage device 106, any net ionic movement may be canceled by the counterbalancing voltage levels CC and CD.

Thereafter, the row address line may be maintained at approximately the intermediate voltage level RCA, and the column address line may be driven to approximately the intermediate voltage level RCA following the predetermined cycle D pulse duration.

In order to write the selected storage device 106 to a second polarity that is different than (e.g., opposite to) the first polarity, following an idle period at E, at cycle F, the corresponding row address line of the selected storage device 106 may be driven to the low voltage level in preparation for the write of the opposite polarity compared to the polarity of the write at cycle C. For example, for the idle period at E, the row address line and the column address line may be driven to approximately an intermediate voltage level RCE for a cycle E. According to an example, the intermediate voltage level RCA may be approximately equal to the intermediate voltage level RCE. The intermediate voltage level RCE may correspond to an idle condition of the memory array 104. Further, the row address line may be driven to a voltage level RF lower than the intermediate voltage level RCE for a predetermined cycle F pulse duration following the cycle E, and the column address line may be maintained at approximately the intermediate voltage level RCE for the predetermined cycle F pulse duration.

At cycle G, the corresponding column address line of the selected storage device 106 may be driven to a full potential so that the selected storage device 106 is written. For example, the row address line may be driven to a voltage level RG higher than the intermediate voltage level RCE for a predetermined cycle G pulse duration following the predetermined cycle F pulse duration, and the column address line may be driven to a voltage level CG lower than the intermediate voltage level RCE for the predetermined cycle G pulse duration to write the storage device to the second polarity. At cycle G, the selected storage device 106 may be written to the second polarity that is opposite to the first polarity for the write at cycle C based on the characteristics of the selected storage device 106. The voltage levels RF and RG may be defined such that the predetermined cycle F pulse duration for the row address line counterbalances the predetermined cycle G pulse duration for the row address line. Therefore, for half-selected storage devices 106 along the row address line for the selected storage device 106, any net ionic movement may be canceled by the counterbalancing voltage levels RF and RG.

Further to the write at cycle G, the balancing column pulse may occur on cycle H. For example, the row address line may be driven to approximately the intermediate voltage level RCE, and the column address line may be driven to a voltage level CH higher than the intermediate voltage level RCE for a predetermined cycle H pulse duration following the predetermined cycle G pulse duration. The voltage levels CG and CH may be defined such that the predetermined cycle G pulse duration for the column address line counterbalances the predetermined cycle H pulse duration for the column address line. Therefore, for half-selected storage devices 106 along the column address line for the selected storage device 106, any net ionic movement may be canceled by the counterbalancing voltage levels CG and CH.

Thereafter, the row address line may be maintained at approximately the intermediate voltage level RCE, and the column address line may be driven to approximately the intermediate voltage level RCE following the predetermined cycle H pulse duration.

Figure 3:
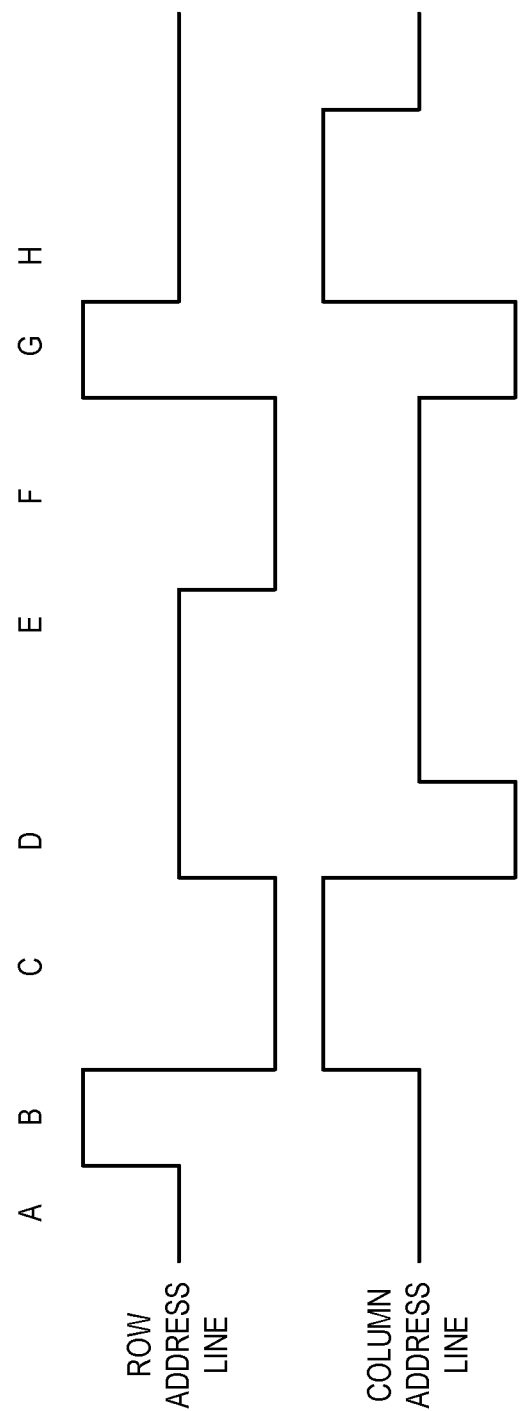
FIG. 3 illustrates another length and phase diagram of row and column pulses applied by the storage device write pulse control apparatus, according to an example of the present disclosure.
Figure 4:
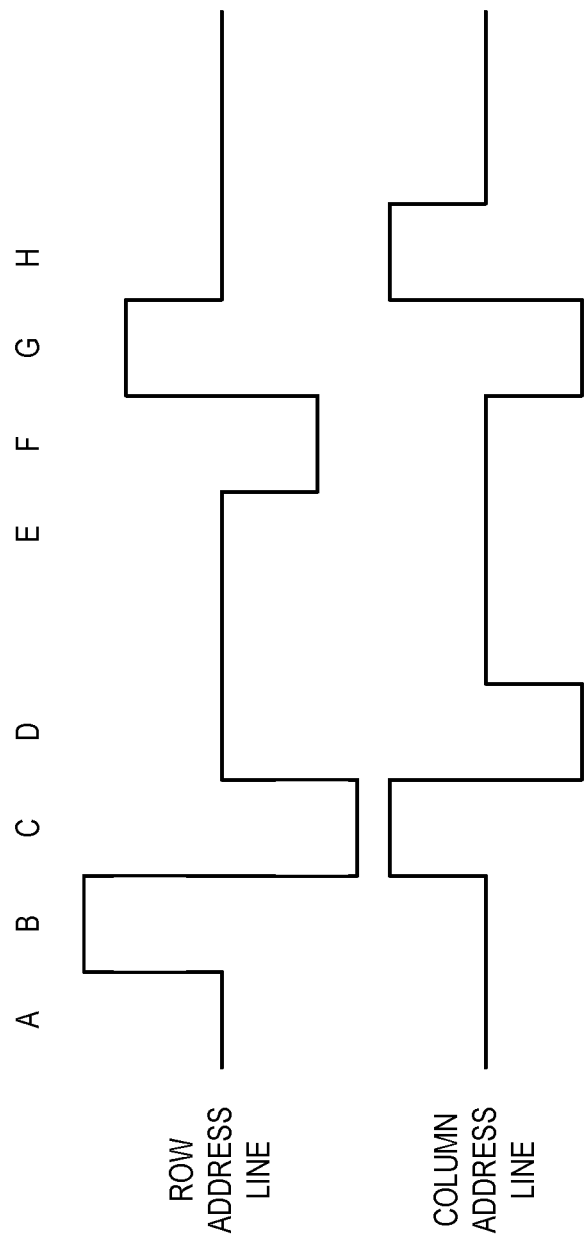
FIG. 4 illustrates another length and phase diagram of row and column pulses applied by the storage device write pulse control apparatus, according to an example of the present disclosure.

Referring to FIGS. 1-4, FIGS. 3 and 4 illustrate length and phase diagrams of row and column pulses applied by the storage device write pulse control apparatus 100, according to examples of the present disclosure. Referring to FIGS. 2 and 3, FIG. 2 generally illustrates pulses of equal width and amplitude. However, since ionic movement for a selected storage device 106 may be easier in one direction (e.g., in a direction where drift and diffusion are aligned) than the other, pulse lengths and/or pulse amplitudes may be systematically altered. For example, as shown in FIG. 3, pulse length C of the row and column address lines, pulse length F of the row address line, and pulse length H of the column address line, may be altered. Generally, the predetermined cycle B, cycle C, and cycle D pulse durations, and further, the predetermined cycle F, cycle G, and cycle H pulse durations may be defined such that any one or a combination of these pulse durations may be different than the remaining pulse durations. Further, as shown in FIG. 4, pulse amplitudes B and C of the row address line may be altered. For the examples of FIGS. 3 and 4, the polar orientation of the storage devices 106 is such that the direction of easier ionic movement is when row is high and column is low. The degree of pulse width and amplitude variation may be based on analysis of the characteristics of the particular storage device 106.

Figure 6:
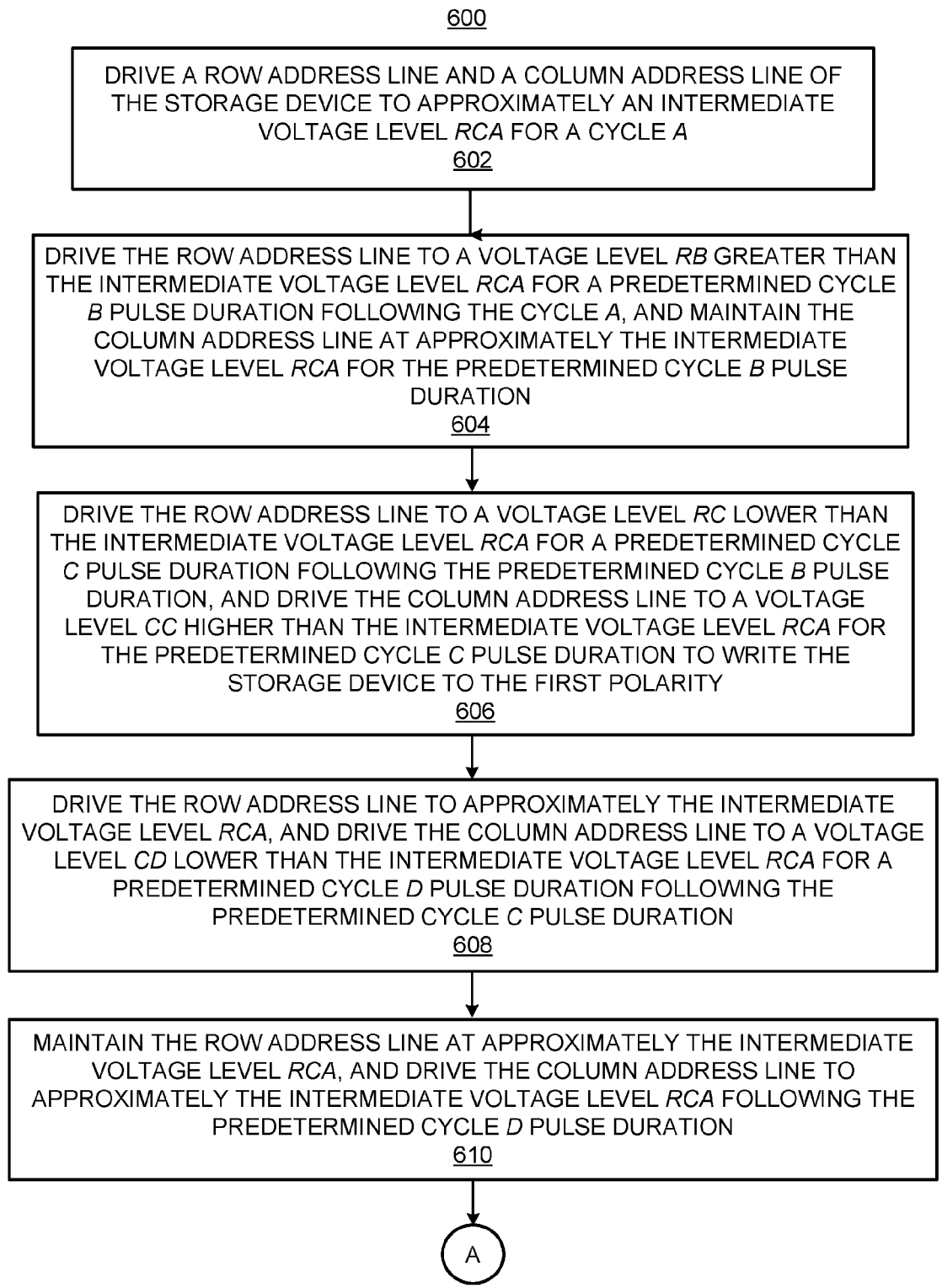
FIG. 6 illustrates further details of the method for storage device write pulse control, according to an example of the present disclosure.
Figure 6:
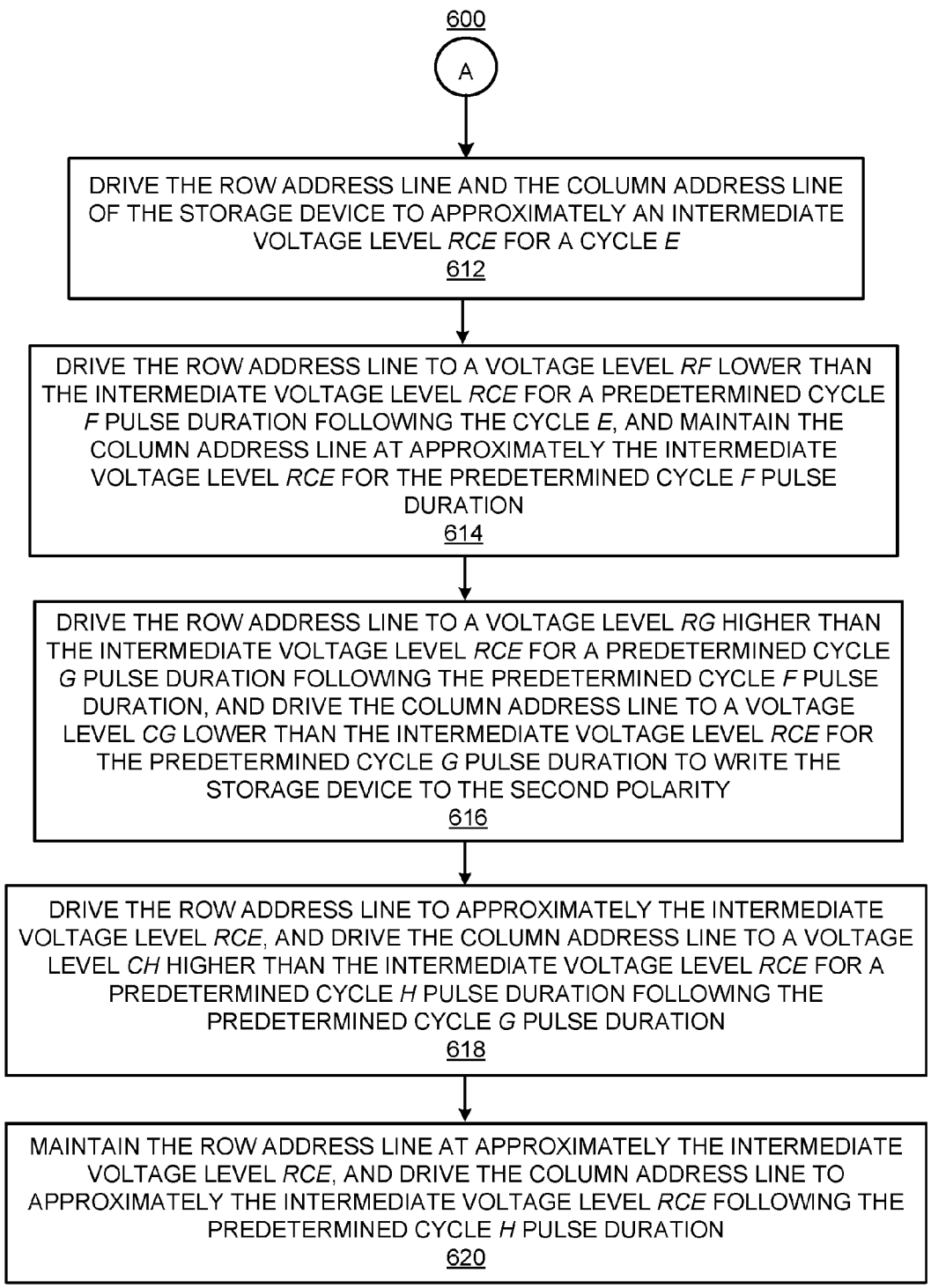

FIGS. 5 and 6 respectively illustrate flowcharts of methods 500 and 600 for storage device write pulse control, corresponding to the example of the storage device write pulse control apparatus 100 whose construction is described in detail above. The methods 500 and 600 may be implemented on the storage device write pulse control apparatus

100 with reference to FIGS. 1-4 by way of example and not limitation. The methods 500 and 600 may be practiced in other apparatus.

Referring to FIG. 5, for the method 500, at block 502, in order to write the storage device to a first polarity, a row address line and a column address line of the storage device may be driven to approximately an intermediate voltage level RCA for a cycle A (see, for example, FIGS. 1 and 2).

At block 504, the row address line may be driven to a voltage level RB greater than the intermediate voltage level RCA for a predetermined cycle B pulse duration following the cycle A, and the column address line may be maintained at approximately the intermediate voltage level RCA for the predetermined cycle B pulse duration (see, for example, FIGS. 1 and 2).

At block 506, the row address line may be driven to a voltage level RC lower than the intermediate voltage level RCA for a predetermined cycle C pulse duration following the predetermined cycle B pulse duration, and the column address line may be driven to a voltage level CC higher than the intermediate voltage level RCA for the predetermined cycle C pulse duration to write the storage device to the first polarity (see, for example, FIGS. 1 and 2).

At block 508, the row address line may be driven to approximately the intermediate voltage level RCA, and the column address line may be driven to a voltage level CD lower than the intermediate voltage level RCA for a predetermined cycle D pulse duration following the predetermined cycle C pulse duration (see, for example, FIGS. 1 and 2).

At block 510, the row address line may be maintained at approximately the intermediate voltage level RCA, and the column address line may be driven to approximately the intermediate voltage level RCA following the predetermined cycle D pulse duration (see, for example, FIGS. 1 and 2).

Referring to FIG. 6, for the method 600, at block 602, in order to write the storage device to a first polarity, a row address line and a column address line of the storage device may be driven to approximately an intermediate voltage level RCA for a cycle A (see, for example, FIGS. 1 and 2).

At block 604, the row address line may be driven to a voltage level RB greater than the intermediate voltage level RCA for a predetermined cycle B pulse duration following the cycle A, and the column address line may be maintained at approximately the intermediate voltage level RCA for the predetermined cycle B pulse duration (see, for example, FIGS. 1 and 2).

At block 606, the row address line may be driven to a voltage level RC lower than the intermediate voltage level RCA for a predetermined cycle C pulse duration following the predetermined cycle B pulse duration, and the column address line may be driven to a voltage level CC higher than the intermediate voltage level RCA for the predetermined cycle C pulse duration to write the storage device to the first polarity (see, for example, FIGS. 1 and 2).

At block 608, the row address line may be driven to approximately the intermediate voltage level RCA, and the column address line may be driven to a voltage level CD lower than the intermediate voltage level RCA for a predetermined cycle D pulse duration following the predetermined cycle C pulse duration (see, for example, FIGS. 1 and 2).

At block 610, the row address line may be maintained at approximately the intermediate voltage level RCA, and the column address line may be driven to approximately the intermediate voltage level RCA following the predetermined cycle D pulse duration (see, for example, FIGS. 1 and 2).

At block 612, in order to write the storage device to a second polarity that is different than to the first polarity, the row address line and the column address line of the storage device may be driven to approximately an intermediate voltage level RCE for a cycle E (see, for example, FIGS. 1 and 2).

At block 614, the row address line may be driven to a voltage level RF lower than the intermediate voltage level RCE for a predetermined cycle F pulse duration following the cycle E, and the column address line may be maintained at approximately the intermediate voltage level RCE for the predetermined cycle F pulse duration (see, for example, FIGS. 1 and 2).

At block 616, the row address line may be driven to a voltage level RG higher than the intermediate voltage level RCE for a predetermined cycle G pulse duration following the predetermined cycle F pulse duration, and the column address line may be driven to a voltage level CG lower than the intermediate voltage level RCE for the predetermined cycle G pulse duration to write the storage device to the second polarity (see, for example, FIGS. 1 and 2).

At block 618, the row address line may be driven to approximately the intermediate voltage level RCE, and the column address line may be driven to a voltage level CH higher than the intermediate voltage level RCE for a predetermined cycle H pulse duration following the predetermined cycle G pulse duration (see, for example, FIGS. 1 and 2).

At block 620, the row address line may be maintained at approximately the intermediate voltage level RCE, and the column address line may be driven to approximately the intermediate voltage level RCE following the predetermined cycle H pulse duration (see, for example, FIGS. 1 and 2).

Figure 7:
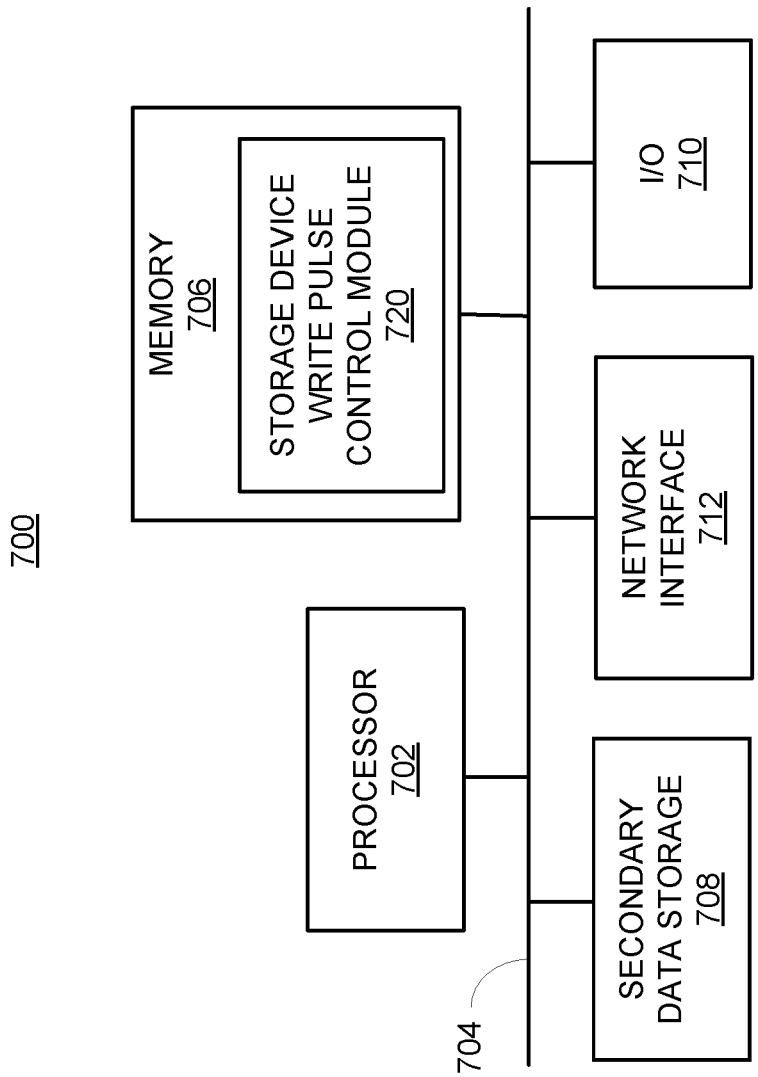
FIG. 7 illustrates a computer system, according to an example of the present disclosure.

FIG. 7 shows a computer system 700 that may be used with the examples described herein. The computer system represents a generic platform that includes components that may be in a server or another computer system. The computer system 700 may be used as a platform for the apparatus 100. The computer system 700 may execute, by a processor or other hardware processing circuit, the methods, functions and other processes described herein. These methods, functions and other processes may be embodied as machine readable instructions stored on a computer readable medium, which may be non-transitory, such as hardware storage devices (e.g., RAM (random access memory), ROM (read only memory), EPROM (erasable, programmable ROM), EEPROM (electrically erasable, programmable ROM), hard drives, and flash memory).

The computer system 700 includes a processor 702 that may implement or execute machine readable instructions performing some or all of the methods, functions and other processes described herein. Commands and data from the processor 702 are communicated over a communication bus 704. The computer system also includes a main memory 706, such as a random access memory (RAM), where the machine readable instructions and data for the processor 702 may reside during runtime, and a secondary data storage 708, which may be non-volatile and stores machine readable instructions and data. The memory and data storage are examples of computer readable mediums. The memory 706 may include a storage device write pulse control module 720 including machine readable instructions residing in the memory 706 during runtime and executed by the processor 702. The storage device write pulse control module 720 may include the modules of the apparatus shown in FIG. 1.

The computer system 700 may include an I/O device 710, such as a keyboard, a mouse, a display, etc. The computer system may include a network interface 712 for connecting to a network. Other known electronic components may be added or substituted in the computer system.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. A method for storage device write pulse control of a storage device of a plurality of storage devices of a storage array, the method comprising:
   writing the storage device to a first polarity by:
     driving a row address line and a column address line of the storage device to approximately an intermediate voltage level RCA for a cycle A;
     driving the row address line to a voltage level RB greater than the intermediate voltage level RCA for a predetermined cycle B pulse duration following the cycle A, and maintaining the column address line at approximately the intermediate voltage level RCA for the predetermined cycle B pulse duration;
     driving the row address line to a voltage level RC lower than the intermediate voltage level RCA for a predetermined cycle C pulse duration following the predetermined cycle B pulse duration, and driving the column address line to a voltage level CC higher than the intermediate voltage level RCA for the predetermined cycle C pulse duration to write the storage device to the first polarity;
     driving the row address line to approximately the intermediate voltage level RCA, and driving the column address line to a voltage level CD lower than the intermediate voltage level RCA for a predetermined cycle D pulse duration following the predetermined cycle C pulse duration; and
     maintaining the row address line at approximately the intermediate voltage level RCA, and driving the column address line to approximately the intermediate voltage level RCA following the predetermined cycle D pulse duration.

2. The method of claim 1, further comprising:
   writing the storage device to a second polarity that is different than to the first polarity by:
     driving the row address line and the column address line of the storage device to approximately an intermediate voltage level RCE for a cycle E;
     driving the row address line to a voltage level RF lower than the intermediate voltage level RCE for a predetermined cycle F pulse duration following the cycle E, and maintaining the column address line at approximately the intermediate voltage level RCE for the predetermined cycle F pulse duration;
     driving the row address line to a voltage level RG higher than the intermediate voltage level RCE for a predetermined cycle G pulse duration following the predetermined cycle F pulse duration, and driving the column address line to a voltage level CG lower than the intermediate voltage level RCE for the predetermined cycle G pulse duration to write the storage device to the second polarity;
     driving the row address line to approximately the intermediate voltage level RCE, and driving the column address line to a voltage level CH higher than the intermediate voltage level RCE for a predetermined cycle H pulse duration following the predetermined cycle G pulse duration; and
     maintaining the row address line at approximately the intermediate voltage level RCE, and driving the column address line to approximately the intermediate voltage level RCE following the predetermined cycle H pulse duration.

3. The method of claim 2, wherein the intermediate voltage level RCA is approximately equal to the intermediate voltage level RCE.

4. The method of claim 1, further comprising:
   defining the voltage levels RB and RC such that the predetermined cycle B pulse duration for the row address line is to counterbalance the predetermined cycle C pulse duration for the row address line; and
   defining the voltage levels CC and CD such that the predetermined cycle C pulse duration for the column address line is to counterbalance the predetermined cycle D pulse duration for the column address line.

5. The method of claim 2, further comprising:
   defining the voltage levels RF and RG such that the predetermined cycle F pulse duration for the row address line is to counterbalance the predetermined cycle G pulse duration for the row address line; and
   defining the voltage levels CG and CH such that the predetermined cycle G pulse duration for the column address line is to counterbalance the predetermined cycle H pulse duration for the column address line.

6. The method of claim 1, further comprising:
   defining the predetermined cycle B, cycle C, and cycle D pulse durations such that each of the pulse durations is equal.

7. The method of claim 2, further comprising:
   defining the predetermined cycle F, cycle G, and cycle H pulse durations such that each of the predetermined cycle F, cycle G, and cycle H pulse durations is equal.

8. The method of claim 1, further comprising:
   defining the predetermined cycle B, cycle C, and cycle D pulse durations such that at least one of the pulse durations is different than the remaining pulse durations.

9. The method of claim 2, further comprising:
   defining the predetermined cycle F, cycle G, and cycle H pulse durations such that at least one of the predetermined cycle F, cycle G, and cycle H pulse durations is different than the remaining predetermined cycle F, cycle G, and cycle H pulse durations.

10. The method of claim 1, wherein the storage device is a memristor.

11. The method of claim 1, wherein the plurality of storage devices represent a memristor array.

12. A non-transitory computer readable medium having stored thereon machine readable instructions to provide storage device write pulse control of a storage device of a plurality of storage devices of a storage array, the machine readable instructions, when executed, cause a computer system to:
   write the storage device to a first polarity by:
     driving a row address line and a column address line of the storage device to approximately an intermediate voltage level RCE for a cycle E;
     driving the row address line to a voltage level RF lower than the intermediate voltage level RCE for a predetermined cycle F pulse duration following the cycle E, and maintaining the column address line at approximately the intermediate voltage level RCE for the predetermined cycle F pulse duration;

driving the row address line to a voltage level RG higher than the intermediate voltage level RCE for a predetermined cycle G pulse duration following the predetermined cycle F pulse duration, and driving the column address line to a voltage level CG lower than the intermediate voltage level RCE for the predetermined cycle G pulse duration to write the storage device to the first polarity;

driving the row address line to approximately the intermediate voltage level RCE, and driving the column address line to a voltage level CH higher than the intermediate voltage level RCE for a predetermined cycle H pulse duration following the predetermined cycle G pulse duration; and maintaining the row address line at approximately the intermediate voltage level RCE, and driving the column address line to approximately the intermediate voltage level RCE following the predetermined cycle H pulse duration.

13. The non-transitory computer readable medium of claim 12, wherein the machine readable instructions, when executed, further cause the computer system to:

write the storage device to a second polarity that is different than to the first polarity by:

driving the row address line and the column address line of the storage device to approximately an intermediate voltage level RCA for a cycle A;

driving the row address line to a voltage level RB greater than the intermediate voltage level RCA for a predetermined cycle B pulse duration following the cycle A, and maintaining the column address line at approximately the intermediate voltage level RCA for the predetermined cycle B pulse duration;

driving the row address line to a voltage level RC lower than the intermediate voltage level RCA for a predetermined cycle C pulse duration following the predetermined cycle B pulse duration, and driving the column address line to a voltage level CC higher than the intermediate voltage level RCA for the predetermined cycle C pulse duration to write the storage device to the second polarity;

driving the row address line to approximately the intermediate voltage level RCA, and driving the column address line to a voltage level CD lower than the intermediate voltage level RCA for a predetermined cycle D pulse duration following the predetermined cycle C pulse duration; and maintaining the row address line at approximately the intermediate voltage level RCA, and driving the column address line to approximately the intermediate voltage level RCA following the predetermined cycle D pulse duration.

14. A storage device write pulse control apparatus for writing a storage device of a plurality of storage devices of a storage array, the storage device write pulse control apparatus comprising:

a row switch module and a column switch module to respectively:

drive a row address line of the storage device to approximately an intermediate voltage level RA for a cycle A, and drive a column address line of the storage device to approximately an intermediate voltage level CA for the cycle A;

drive the row address line to a voltage level RB greater than the intermediate voltage level RA for a predetermined cycle B pulse duration following the cycle A, and maintain the column address line at approximately the intermediate voltage level CA for the predetermined cycle B pulse duration;

drive the row address line to a voltage level RC lower than the intermediate voltage level RA for a predetermined cycle C pulse duration following the predetermined cycle B pulse duration, and drive the column address line to a voltage level CC higher than the intermediate voltage level CA for the predetermined cycle C pulse duration to write the storage device to the first polarity;

drive the row address line to approximately the intermediate voltage level RA, and drive the column address line to a voltage level CD lower than the intermediate voltage level CA for a predetermined cycle D pulse duration following the predetermined cycle C pulse duration; and maintain the row address line at approximately the intermediate voltage level RA, and drive the column address line to approximately the intermediate voltage level CA following the predetermined cycle D pulse duration.

15. The storage device write pulse control apparatus of claim 14, wherein the storage device is a memristor.

* * * * *